(12) United States Patent
Cok

(10) Patent No.: US 6,936,960 B2
(45) Date of Patent: Aug. 30, 2005

(54) OLED DISPLAYS HAVING IMPROVED CONTRAST

(75) Inventor: Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 10/340,489

(22) Filed: Jan. 10, 2003

(65) Prior Publication Data

US 2004/0135499 A1 Jul. 15, 2004

(51) Int. Cl.⁷ .............................................. H05B 33/00
(52) U.S. Cl. ...................... 313/506; 313/504; 313/512; 313/110; 313/112; 345/76; 345/82
(58) Field of Search ................ 313/512, 502–504, 313/505, 506, 112, 113; 438/40, 29; 428/690, 917

(56) References Cited

U.S. PATENT DOCUMENTS

| | | | | |
|---|---|---|---|---|
| 6,117,529 A | * | 9/2000 | Leising et al. ............... | 428/209 |
| 6,268,295 B1 | | 7/2001 | Ohta et al. | |
| 6,411,019 B1 | | 6/2002 | Hofstra et al. ............... | 313/112 |
| 6,476,783 B2 | * | 11/2002 | Matthies et al. ............... | 345/82 |
| 6,641,933 B1 | * | 11/2003 | Yamazaki et al. ........... | 428/690 |
| 6,770,502 B2 | * | 8/2004 | Cok et al. ...................... | 438/40 |
| 2002/0050958 A1 | | 5/2002 | Matthies et al. | |

FOREIGN PATENT DOCUMENTS

| | | | |
|---|---|---|---|
| JP | 11-162634 | 6/1999 | |
| JP | 2001033613 A | * 2/2001 | ............ G02B/5/20 |
| JP | 2001-126864 | 5/2001 | |
| WO | WO 00/3665 | 6/2000 | |
| WO | WO 02/10845 A2 | 2/2002 | |

* cited by examiner

Primary Examiner—Joseph Williams
Assistant Examiner—Sikha Roy
(74) Attorney, Agent, or Firm—Andrew J. Anderson; Thomas H. Close

(57) ABSTRACT

An OLED display device includes a substrate; an array of OLED elements disposed over one side of the substrate to emit light in a direction; circuitry to drive the OLED elements located beside the array of OLED elements on the substrate; a light absorbing material located above the circuitry in the direction of light emission; and a circular polarizer located above the circuitry, the OLED elements, and the light absorbing material in the direction of light emission.

25 Claims, 3 Drawing Sheets

OLED DISPLAYS HAVING IMPROVED CONTRAST

FIELD OF THE INVENTION

The present invention relates to organic light emitting diode (OLED) displays, and more particularly, to improving the contrast of the display.

BACKGROUND OF THE INVENTION

Flat-panel displays, such as organic light emitting diode (OLED) displays, of various sizes are proposed for use in many computing and communication applications. In particular, OLED displays are proposed for use in both indoor and outdoor applications under a wide variety of ambient lighting conditions. Indoor applications have relatively low ambient illumination and require lower levels of display luminance. In contrast, outdoor applications can have a high ambient luminance and may require higher levels of display luminance together with low display reflectance. Moreover, most OLED displays are proposed for use in conditions of both high or low to non-existent ambient illumination, from outdoor use during the day to night-time use in a dark room.

Current illumination and display visibility standards cite 75,000 lux as a standard for outdoor illumination on a bright and sunny day. Cloudy bright days have an illumination of 16,000 lux, cloudy dull days have a brightness of 6,000 lux, and a cloudy very dull day has a brightness of 1,000 lux. Indoor illumination ranges from 0 to 1000 lux. Viewability standards for display devices set the minimum display contrast ratio standard for reading text on a display at three. Other sorts of displayed information, such as images, require a higher contrast, for example ten.

Given the wide variety of viewing conditions proposed for OLED displays, it is difficult to design an OLED display having suitable contrast. OLED displays rely on the use of conductive electrodes, typically some form of highly reflective metal, to provide current to an emissive layer of organic material. The reflective metals reflect ambient light to a display viewer, thereby making the display difficult to view. Moreover, an OLED display device includes both light emitting areas and non-light emitting areas. The non-light emitting areas are typically composed of circuitry such as thin-film transistors, capacitors, drivers, and signal lines.

One way of improving contrast in an OLED display device is to use a circular polarizer over the display. The circular polarizer includes a polarizer and a quarter wave plate. The polarizer polarizes ambient light falling on the display, and the quarter wave plate rotates the direction of polarization of the polarized light by 45 degrees. Any polarized light that is subsequently reflected back through the quarter wave plate is further rotated by 45 degrees so that its direction of polarization is orthogonal to the polarizer, and hence is substantially completely absorbed by the polarizer. Circular polarizers absorb approximately 60% of the light that passes through the polarizer once. About 99.5% of the ambient light that is specularly reflected back through the circular polarizer is absorbed. Hence, about 60% of the light emitted by the OLED display device through the circular polarizer is lost, while 99.5% of the ambient light that falls on the surface of the OLED display device is absorbed. Suitable circular polarizers are commercially available, for example from 3M and are described in the patent literature. See for example, WO02/10845 A2 by Trapani et al., published Feb. 7, 2002, which describes a high durability circular polarizer including an unprotected K-type polarizer and a quarter-wavelength retarder that is designed for use with an emissive display module such as an organic light emitting diode or a plasma display device. However, even with the use of circular polarizers, the contrast of OLED devices is not adequate for use outdoors.

A second means of improving contrast in an OLED display device is to place an absorptive layer such as a light absorbing material or a destructive interference layer within a cavity at the back of the device, for example on the substrate or an electrode. See for example U.S. Pat. No. 6,411,019 B1, issued Jun. 25, 2002 to Hofstra et al. The absorptive layer absorbs the ambient light in addition to any light emitted from the emissive layer of organic materials. However, this approach has the difficulty that most of the light emitted from the OLED toward the absorptive layer is lost, thereby severely reducing the brightness of the display.

A third means of improving contrast in an OLED display device is to provide a matrix of light absorbing material called a black matrix between the light emitting elements and around the edges of the display device. See for example, U.S. patent application Ser. No. 2002/0050958 A1 by Matthies, et al., published May 2, 2002. This approach is capable of significantly reducing the reflectance of the display, but still allows substantial ambient light to be reflected from the display by reflection from the reflective anodes of the light emitting elements.

There is a need therefore for an improved OLED display device that has improved contrast.

SUMMARY OF THE INVENTION

The need is met by providing an OLED display device that includes a substrate; an array of OLED elements disposed over one side of the substrate to emit light in a direction; circuitry to drive the OLED elements located beside the array of OLED elements on the substrate; a light absorbing material located above the circuitry in the direction of light emission; and a circular polarizer located above the circuitry, the OLED elements, and the light absorbing material in the direction of light emission.

ADVANTAGES

The present invention has the advantage that it increases the contrast of an OLED display device across a wide range of ambient illumination.

It will be understood that the figures are not to scale since the individual layers are too thin and the thickness differences of various layers too great to permit depiction to scale.

DETAILED DESCRIPTION OF THE INVENTION

Figure 1:
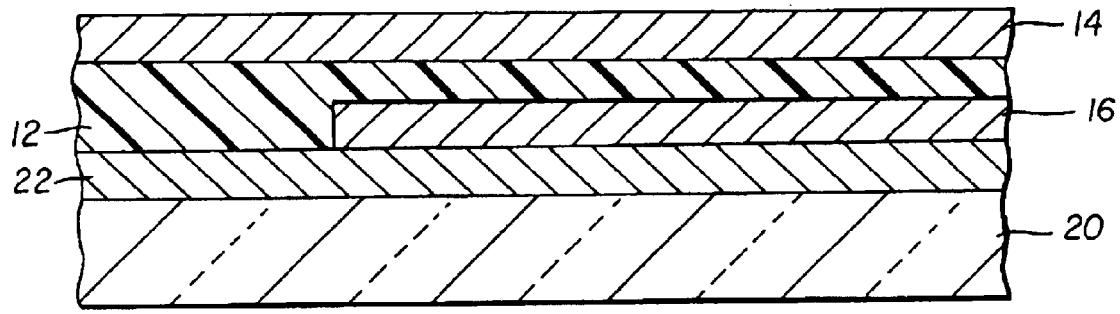
FIG. 1 is a partial cross sectional schematic diagram of a prior art OLED display device having a circular polarizer.

Referring to FIG. 1, a prior art OLED display device having a circular polarizer to enhance contrast includes a substrate 20 on which is formed circuitry 22. Some of the circuitry is located under a light emissive area defined by an electrode 16 connected to the circuitry 22. An OLED emissive layer 12 is deposited on the device in contact with electrode 16 and may include further layers as is known in the art. A second electrode 14 also connected to the circuitry 22 is located above the OLED emissive area 12 and may extend above the circuitry layer 22. Light is emitted from emissive layer 12 in the areas above electrode 16 when current is caused by circuitry 22 to flow between electrodes 16 and 14. A cover 36 encapsulates the device and includes a circular polarizer 50 to improve the ambient contrast of the display.

The circular polarizer absorbs about 99.5 percent of the ambient light falling on the display, and about 60 percent of the light emitted by the display is absorbed by the circular polarizer. An ambient contrast ratio of about 5 can be expected from such a display driven at 100 candelas per square meter emission and assuming a 50% fill factor and 100% reflectivity from all areas of the display operating under cloudy conditions. The fill factor is defined as the percentage of the area of the display that is light emissive (i.e. for a 50% fill factor, half of the area of the display is taken up by the electrodes 16 (i.e. the light emitting portions of the light emissive layer 12). The ambient contrast ratio is calculated as the ratio of the reflected ambient light plus emitted light to the reflected ambient light.

Figure 2:
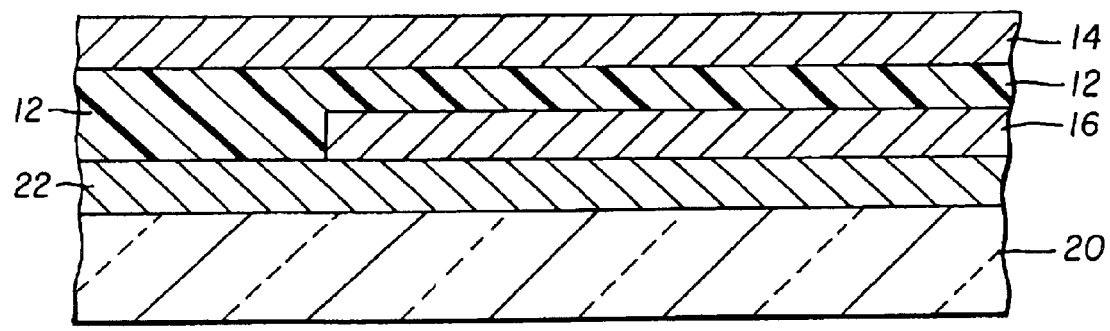
FIG. 2 is a partial cross sectional schematic diagram of a prior art OLED display device having a black matrix and reflective anode.

Referring to FIG. 2 a prior art OLED display device having a black matrix 54 to enhance the ambient contrast of the display device includes a light absorbing layer over the non-light emissive area of the device. The black matrix 54 covers any non light emissive areas between pixels and can also extend around the perimeter of the display device. The black matrix 54 absorbs about 97 percent of the light falling on the mask, however about 97% of the ambient light falling on the OLED elements is reflected. A typical ambient contrast ratio of about 1.1 can be expected to be achieved by such a display with 100 candelas per square meter emission and a 50% fill factor under cloudy conditions.

It could be expected that by adding a circular polarizer to a display having a black matrix, a contrast ratio of about 5 would be achieved, since the black matrix would be expected to disrupt the polarization of the light falling on the black matrix portion of the display resulting in about 0.5% of the light falling on the black matrix being reflected from the display (which is the product of 40%, 40% and 3%). Thus it was expected that no improvement in contrast would be gained by providing a circular polarizer to a display having a black matrix.

However, experiments performed by applicant surprisingly and unexpectedly showed that when a circular polarizer is added to an OLED display device having a black matrix, the disruption in polarization state due to the black matrix is much lower than would be expected and the actual reflection experienced from the black matrix portion of the display is about 0.015% rather than 0.5%, resulting in an unexpected improvement in ambient contrast ratio. For a display with 100 candelas per square meter emission and a 50% fill factor under cloudy conditions, using the combination of black matrix and circular polarizer of the present invention, the ambient contrast ratio was found to be 9, almost double the contrast ratio with polarizer alone, and about 8 times the contrast ratio with the black matrix alone.

Figure 3:
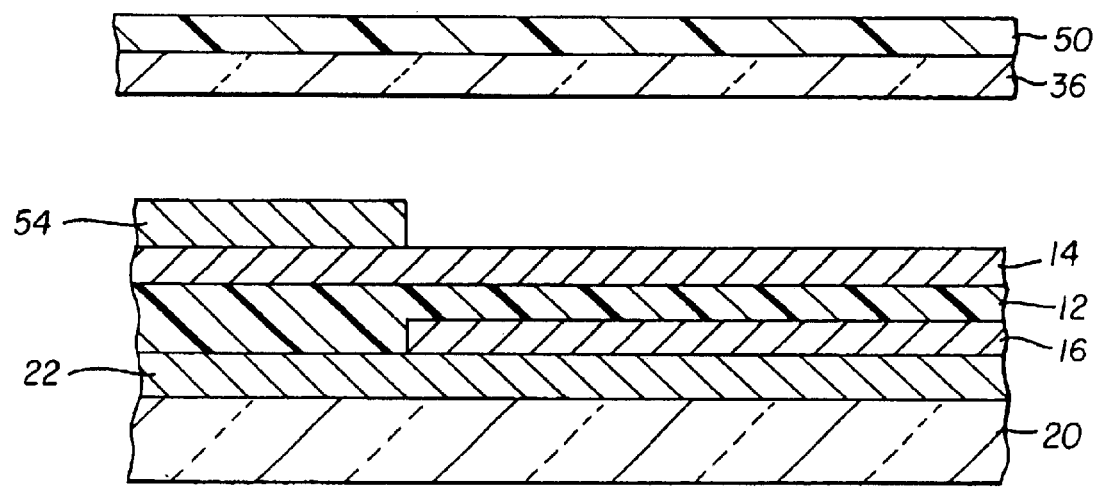
FIGS. 3 and 3A are partial cross sectional schematic diagrams of OLED devices according to embodiments of the present invention.

Referring to FIG. 3, one embodiment of the present invention includes a substrate with a reflective first electrode 16, an OLED light emitting layer 12, and a second electrode 14. An optional electrode protection layer (not shown) may be placed above the second electrode 14. A black matrix 54 is placed above the second electrode 14 in the non light emissive areas of the display. An encapsulating cover 36 is affixed over the substrate 20. A circular polarizer 50 is placed above the encapsulating cover. Alternatively, the circular polarizer 50 may be placed inside the encapsulating cover 36.

A suitable light absorbing material for the black matrix may be selected from the group comprising dyes and pigments. Pigments can include, for example, carbon black, graphite, metal oxides, metal sulfides, and metal complexes such as phthalocyanines. Black resin materials, black chrome, and antireflection layers may also be used to provide the black matrix. In a further embodiment of the present invention, the light absorber may have desiccating properties, thereby improving the lifetime of the organic layers.

In operation, light emitted from the OLED light emitting layer 12 is emitted through the cover 36 and circular polarizer 50. Light emitted toward the back of the device is reflected from the first electrode 16, through the cover 36 and circular polarizer 50. No light is emitted from areas not between electrodes 16 and 14. Any light reflected from the inside of the cover 36 onto the black matrix 54 is absorbed, thereby improving the sharpness and contrast of the device.

Ambient light passes through the circular polarizer 50. The black matrix 54 absorbs most of the ambient light that falls between the light emitting areas. It has been found that light reflected from the black matrix 54 is absorbed by the circular polarizer 50. Light that passes through the black matrix 54 and is reflected back is mostly absorbed by the black matrix 54. It has been found that reflected light that passes through the black matrix 54 is absorbed by the circular polarizer. Ambient light that is reflected from the electrode 16 is absorbed by the circular polarizer as is done in the prior art. Since the fill factor (the ratio of light emitting area to non light emitting area) is much less than 100% (often 50% or less) the additional light absorption provided by the black matrix 54 significantly decreases the overall reflectivity of the device without deleteriously affecting the light emitted, thereby improving the contrast of the device.

The present invention may be applied to both top- and bottom-emitter OLED displays. In the bottom emitter case, the black matrix may be placed between the circuitry 22 and the substrate 20 and the circular polarizer 50 placed on the outside of the substrate. Planarization and conductive layers may be placed over or under the black matrix 54.

An optional transparent protection layer (not shown) may be provided in direct contact with the second electrode 14. When provided, the protection layer may comprise inorganic materials such as SiOx or SiNx, for example, as disclosed in JP 2001126864. Alternatively, the protection layer may comprise organic materials such as polymers, including but not limited to, Teflon®, polyimides, and polymers disclosed in JP 11-162634. Protection layer may comprise multiple layers of organic or inorganic materials, or combinations thereof. Alternating inorganic and organic layers, for example, as disclosed in U.S. Pat. No. 6,268,295 issued Jul. 31, 2001 to Ohta et al., and WO 00/36665 by Graff et al., published Jun. 22, 2000, are useful as protection layers. In all cases, the protection layer should have high optical transparency, preferably greater than 70% transmittance.

The black matrix 54 may be deposited in a pattern using photolithographic techniques known in the art. For example, light absorbing material may be coated as a liquid on the entire surface and exposed to radiation through a mask to polymerize portions of the coating. Portions of the material exposed to the radiation are cured and the remainder is washed away. Dry film photolithography may also be used. In addition, patterned thermal transfer can be used, for example, by coating material onto a donor substrate, placing the donor substrate in contact with or in close proximity to the OLED substrate, and selectively heating the donor with a laser to cause transfer of the light absorbing material to the OLED substrate. The black matrix 54 may comprise a plurality of thinner layers deposited by sequential deposition of light absorbing materials.

In an alternative embodiment, the black matrix 54 may be applied to the inside of transparent cover 36 rather than the top layer on the OLED substrate. Hence, the cover with the black matrix may be prepared separately from the OLED substrate. A similar masking technique as described above may be used to deposit the black matrix 54 onto the cover 36. The cover 36 is aligned with the OLED substrate when the cover is affixed to the substrate to ensure that the light-absorbing grid does not occlude the light from the pixels.

According to a further embodiment, a black matrix 54 is patterned in conjunction with one or more of the layers comprising the organic EL layer such that the patterned layer is provided between the pixel areas. The black matrix may comprise all or a portion of one or more layers, i.e. it can comprise the layer, or be located within one of the layers. In this case, the process by which the device is made is conventional; the only difference being that the material that is used to fill the gaps between pixel areas has light absorbing properties.

The various embodiments of the present invention are not mutually exclusive and can be combined in a single device. For example, black matrix 54 may be patterned on the top layer of the substrate, on the cover, and within other layers. Combining the various embodiments provides further light absorption and contrast enhancement in the display device.

A color OLED display may be provided by an array of light emitting materials 12 that emit different colors of light. Alternatively, the color OLED display may be provided by a white-light emitting OLED layer together with an array of color filters to provide a color display. In this embodiment, the light absorbing material may be created through an overlap of the color filters, for example red and blue, to provide the black matrix.

Figure 3A:
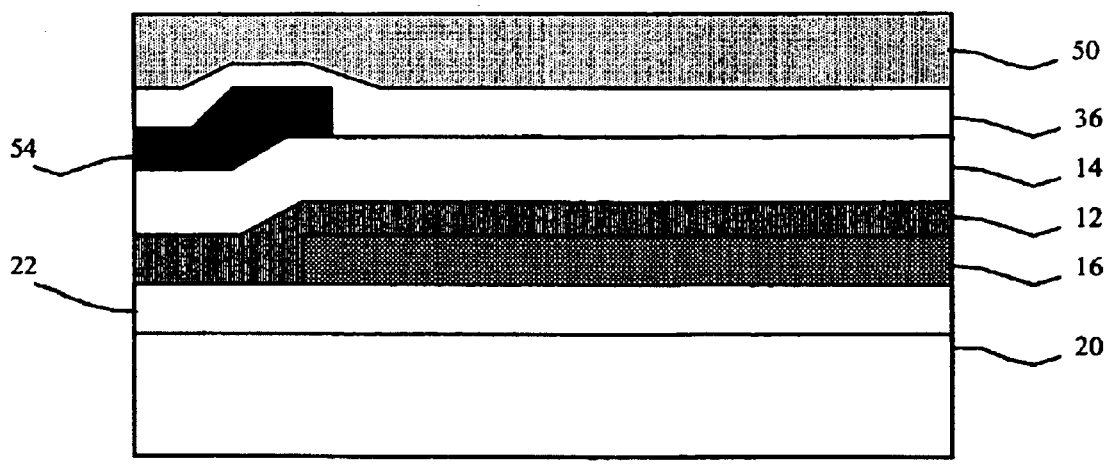

While transparent cover 36 is typically glass or plastic sheet, the cover can comprise materials that are deposited in a conformable manner over the surface of the materials deposited over the substrate, i.e., over OLED substrate with black matrix 54, as shown, e.g., in FIG. 3A. Similarly, the black matrix 54 itself may be conformable to the surface of the materials deposited over the substrate as is also shown in FIG. 3A.

This invention is advantageously practiced with top or bottom-emitting OLED active or passive matrix devices.

The invention has been described in detail with particular reference to certain preferred embodiments thereof, but it will be understood that variations and modifications can be effected within the spirit and scope of the invention.

Parts List

12 OLED emissive layer
14 electrode
16 electrode
20 substrate
22 TFT circuitry
36 cover
50 circular polarizer
54 black matrix

What is claimed is:

1. An OLED display device, comprising:
   a) a substrate;
   b) an array of OLED elements disposed over one side of the substrate to emit light in a direction;
   c) circuitry to drive the OLED elements located beside the array of OLED elements on the substrate;
   d) a black matrix located above the circuitry in the direction of light emission; and
   e) a circular polarizer located above the circuitry, the OLED elements, and the black matrix in the direction of light emission.

2. The display device claimed in claim 1, wherein the OLED display further includes an encapsulating cover located above the OLED elements and affixed to the substrate and the circular polarizer is located on the outside of the encapsulating cover.

3. The display device claimed in claim 1, wherein the OLED display further includes an encapsulating cover located above the OLED elements and affixed to the substrate and the circular polarizer is located on the inside of the encapsulating cover.

4. The display device claimed in claim 1, wherein the OLED elements are a plurality of elements and wherein the plurality of elements includes multiple colors.

5. The display device claimed in claim 4, wherein the OLED elements include a white-light emitter having color filter arrays.

6. The display device claimed in claim 5, wherein the black matrix is composed of a combination of color filters.

7. The display device claimed in claim 5, wherein the black matrix has desiccating properties.

8. The display device claimed in claim 1, wherein the OLED elements further include a first electrode, OLED light-emissive elements, and a second electrode, and wherein the light emission is through the second electrode.

9. The display device claimed in claim 8, wherein the first electrode is reflective or has a reflective layer adjacent to it.

10. The display device claimed in claim 1, wherein the display device is a top-emitter.

11. The display device claimed in claim 1, wherein the display device is a bottom-emitter.

12. The display device claimed in claim 11, wherein the circular polarizer is located on the substrate.

13. The display device claimed in claim 1, wherein the OLED display further includes an encapsulating cover located above the OLED elements and affixed to the substrate and the black matrix is located on the inside of the cover.

14. The display device claimed in claim 1, wherein the black matrix is black.

15. The display device claimed in claim 1, wherein the black matrix is selected from the group consisting of dyes and pigments.

16. The display device claimed in claim 1, wherein the black matrix is selected from the group consisting of carbon black, graphite, metal oxides, and metal sulfides.

17. The display device claimed in claim 1, wherein the black matrix is also provided around the perimeter of the device.

18. The display device claimed in claim 1, wherein the black matrix comprises a plurality of layers.

19. The display device claimed in claim 1, wherein the black matrix is a thick film layer.

20. The display device claimed in claim 1, wherein the black matrix is conformable to the surface of the materials deposited over the substrate.

21. The display device claimed in claim 1, further comprising a transparent cover that is conformable to the surface of the materials deposited over the substrate.

22. A method of manufacturing an OLED display device, comprising the steps of:

a) providing a substrate;

b) forming an array of OLED elements on one side of the substrate to emit light in a direction;

c) forming circuitry located beside the array of OLED elements on the substrate to drive the OLED elements;

d) forming a black matrix above the circuitry in the direction of light emission; and e) locating a circular polarizer above the circuitry, the OLED elements, and the black matrix in the direction of light emission.

23. The method claimed in claim 22, wherein photolithographic processes are used to deposit the black matrix.

24. The method claimed in claim 22, wherein thick film screening printing processes are used to deposit the black matrix.

25. The method claimed in claim 22, wherein black matrix is applied using a thermal transfer process from a donor substrate.

* * * * *